United States Patent [19]
Alard et al.

[11] Patent Number: 5,329,537
[45] Date of Patent: Jul. 12, 1994

[54] METHOD OF MAXIMUM LIKELIHOOD DECODING WITH SUB-SAMPLED DECODING TRELLIS, AND CORRESPONDING DECODING DEVICE

[75] Inventors: Michel Alard, Paris; Damien Castelain; Jean-François Helard, both of Rennes, all of France

[73] Assignee: France Telecom, Paris, France

[21] Appl. No.: 7,140

[22] Filed: Jan. 21, 1993

[30] Foreign Application Priority Data

Jan. 24, 1992 [FR] France ................... 92 01047

[51] Int. Cl.⁵ .................. G06F 11/10; H03M 13/12
[52] U.S. Cl. ........................................ 371/43
[58] Field of Search ............. 371/43, 44, 45; 341/81; 375/18, 83

[56] References Cited

U.S. PATENT DOCUMENTS

| | | | |
|---|---|---|---|
| 4,823,346 | 4/1989 | Kobayashi et al. | 371/43 |
| 4,905,317 | 2/1990 | Suzuki et al. | 341/51 |
| 5,042,036 | 8/1991 | Fettweis | 371/43 |
| 5,056,117 | 10/1991 | Gitlin et al. | 375/102 |
| 5,128,967 | 7/1992 | Durkin et al. | 375/83 |
| 5,185,747 | 2/1993 | Farahati | 371/43 |
| 5,216,694 | 6/1993 | Wei | 375/17 |

OTHER PUBLICATIONS

Eyuboglu et al. "Reduced State Sequence Estimation with Set Partitioning and Decision Feedback" IEEE Trans. on Comm. vol. 36 No. 1 Jun. 1988.

Eyuboglu et al. "Reduced State Sequence Estimation for Trellis Coded Modulation on Intersymbol Interference Channels" IEEE 1988.

Gerhard Fettweis et al., "Minimized Method Viterbi Decoding: 600 M Bit/S Per Chip" Proceedings of the Global Telecommunications Conference, San Diego, Dec. 2–5, 1990 (GLOBECOM '90) vol. 3, 1991.

Tor Aulin, "Two Classes of Algorithms for Asymptotically Optimal Simplified MLSD With Application to Digital Radio", Eurocon, 88: 8th European Conference on Electrotechnics, Jun. 13–17, 1988, Goteborg, Sweden, 1988.

G. David Forney, Jr., "The Vertibi Algorithm" Proceedings of the IEEE vol. 61, No. 3, Mar. 1992, pp. 268–278.

Andrew J. Viterbi, "Error Bounds for Convolutional Codes and an Asymptotically Optimum Decoding Algorithm", IEEE Transactions on Information Theory vol. IT-13, No. 2, Apr. 1967, pp. 260–269.

Primary Examiner—Robert W. Beausoliel, Jr.
Assistant Examiner—Joseph E. Palys
Attorney, Agent, or Firm—Kinney & Lange

[57] ABSTRACT

Decoding apparatus provides the maximum likelihood decoding of a sequence of samples of the type implementing a Viterbi type of decision algorithm that defines an initial decoding trellis. Sub-sampling apparatus sub-samples the initial trellis by a ratio p to preserve nodes corresponding to one sample out of p consecutive samples. This sub-sampling apparatus associates a p order antecedent node to each preserved node. Traceback apparatus traces an optimal path back in the sub-sampled trellis by associating the p order antecedent node for each preserved node. The trace back apparatus designates at least the last two nodes of the optimal path. Over-sampling apparatus over-samples the designation of the last two nodes of the optimal path. The factor p is an integer greater than 1 selected so that there is a single path between a node and its p order antecedent in the initial trellis. Hence the bit rate is increased by a factor p, without loss of information.

10 Claims, 3 Drawing Sheets

METHOD OF MAXIMUM LIKELIHOOD DECODING WITH SUB-SAMPLED DECODING TRELLIS, AND CORRESPONDING DECODING DEVICE

BACKGROUND OF THE INVENTION

1. Field of the Invention

The field of the invention is that of the decoding of digital data coded by means of convolutional codes. More specifically, the invention relates to decoding techniques that implement the decision rule based on maximum likelihood and, notably, techniques using a Viterbi algorithm type of decision algorithm.

Convolutional coding is a technique that is much used at present, notably when the data elements are transmitted in the presence of transmission noise, and for example for the transmission of sound digital signals (in DAB: Digital Audio Broadcasting), of images (in EDB or Earth Digital Broadcasting and HDTV or High Definition Television), of data etc.

The general principle of convolutional coding is based on the association, with a source data element, of at least one coded value, obtained by the linear combination of this source data element with at least one of the previous source data elements.

In a standard way, codes such as these are decoded by means of a Viterbi algorithm type of maximum likelihood algorithm. This algorithm gives a binary estimation of each symbol coded at transmission, on the basis of the corresponding symbol received and of a set of previous symbols received. This binary estimation may be weighted if necessary.

The Viterbi algorithm, which shall be described in greater detail hereinafter, is based on the determination of an optimum path in a trellis, by the systematic elimination of a path from among at least two possible paths reaching each node of the trellis. For each node, therefore, there are determined at least two transition metrics representing the distance between the possible transition on each path and the value effectively received by the decoder. These transition metrics enable the computation of the accumulated metrics, representing the noise accumulated on the path considered. An accumulated metric is thus an integral of the transition metrics. According to the Viterbi algorithm, only the path corresponding to the smallest (surviving) accumulated metric is preserved.

The decoding proper consists in making a trace-back, in the trellis, of this optimum path and in setting the value of the samples received as the values corresponding to the end of this optimum path.

The invention relates essentially to the management of the survivor paths and to the trace-back of the optimum path.

2. Description of the Prior Art

Indeed, the implementation of the maximum likelihood algorithms raises numerous problems, notably when it is desired to implant them in integrated components with a view to their industrial-scale exploitation, and especially for operation at high sampling frequencies.

The problem that arises notably is the standard one of the optimization of the two essential characteristics constituted by the useful surface area of the integrated circuit and the computation time.

Two known methods are implemented in the integrated components presently available on the market. These are called the "trace-back" method and the "register exchange" method.

The trace-back method is implemented, for example, in the different circuits SOR 5053, SOR 5073, SOR 5003, . . . manufactured and distributed by the firm SOREP (registered mark).

It implements a standard RAM (random-access memory) for the storage of the path metrics. The writing of the decisions (survivor paths) into the memory and the trace-back of the optimum path have to be done simultaneously.

In a standard way, this trace-back operation consists of the re-reading, one by one, of the decisions stored in the memory, in the direction opposite that in which they were memorized, so as to trace the optimum path back through the diagram of the trellis.

It can clearly be seen that this method cannot be implemented at very high bit rates owing to the large number of successive writing operations and especially reading operations that have to be performed.

This problem is all the more crucial as, of course, the quality of the decoding is a direct function of the number of samples received that are taken into account, i.e. a function of the length of truncation of the decoding.

The second method of "register exchange" enables operation at higher speeds but at the price of far greater complexity, and hence of a far greater surface area of silicon. Hence, the implementation of this method for the SPORT (registered mark) system, produced and distributed by NTT (registered mark) requires two distinct circuits.

This method uses a shift register for each possible state of the coding, said shift register containing all the information on the path leading to this state. Hence, unlike in the previous method, there is no need to carry out a trace-back on the trellis. The decoding information is obtained directly, which naturally makes it possible to achieve higher bit rates.

These different registers are interconnected, in accordance with the trellis corresponding to the chosen code.

For each new metric computed, the registers are interchanged, as a function of the result of the computation and of the trellis, and the oldest symbols of each of the registers are delivered at output.

Each shift register should have a length equal to the memory of the paths, or length of truncation (the length of truncation represents the depth of the trellis from which it is considered that a decision may be taken with adequate safety).

In other words, this method calls for numerous exchanges of data between registers but, by contrast, no trace-back of the trellis, each register containing all the information on the path leading to the corresponding coding state. It is therefore possible to use this method at high frequencies.

However this method is limited, on the technological plane, by the silicon surface area needed. Indeed, while a memory cell (corresponding to a node of the trellis) requires 4 or 5 transistors in a standard static memory (using the trace-back method), it is constituted by a D flip-flop, i.e. it uses about 15 transistors in the case of the register exchange method.

The surface area needed to store data is therefore multiplied approximately by three. Furthermore, it is generally estimated that the interconnections among the register further double this area.

It is an aim of the invention, notably, to overcome these different drawbacks of the prior art.

SUMMARY OF THE INVENTION

More specifically, it is an aim of the invention to provide a maximum likelihood decoding method for the decoding of data elements coded by means of a convolutional code, said method being capable of being implemented at high bit rates, and notably at bit rates higher than those presently permitted by the decoders according to the optimum path trace-back method.

In other words, the invention is aimed at providing a method of this type that reduces the number of points of access to a memory, for a given length of truncation and which, conversely, enables an increase in this length of truncation, and hence an improvement in the quality of the decoding for a fixed number of reading/writing operations.

Another aim of the invention is to provide a decoding method such as this that necessitates a reasonable surface area of silicon, when it is implanted in an integrated circuit, and notably a surface area smaller than the one required by the register exchange method.

In particular, it is an aim of the invention to provide a method such as this that can be implanted in a single integrated circuit, at a cost price and according to a technology that are compatible with the production of consumer articles for large-scale distribution, for example for the production of receivers of sound signals or of digital images.

In other words, an essential aim of the method of the invention is to provide a method such as this optimizing the ratio between the useful area of silicon and the processing time.

Yet another aim of the invention is to provide a decoding method such as this that can be implemented for the decoding of all types of convolutional codes, and notably for trellis coded modulations (TCM).

Furthermore, it is another aim of the invention to provide a method such as this requiring no matching of the decoders as compared with the standard methods. Notably, an aim of the invention is to provide a method such as this that can be implemented concurrently with other methods, for example in certain particular types of receivers, designed either for high-quality reception or for reception under difficult conditions.

In other words, the invention is aimed at providing a method such as this that introduces no modification of standard decision algorithms as regards the result of the coding, but optimizes the processing time and the surface area of silicon.

These aims, as well as others that shall appear here below, are achieved according to the invention by means of a method for the maximum likelihood decoding of a sequence of samples corresponding to the convolutional coding of a sequence of digital source elements, of the type implementing a Viterbi algorithm type of decision algorithm, defining an initial decoding trellis, constituted by a set of nodes corresponding to the possible states of the coding, each node being connected to its most probable direct antecedent node, and consisting in making a trace-back of an optimum path in said trellis, said method comprising the following steps:

sub-sampling, by a ratio p, of said initial trellis, consisting in preserving only the nodes corresponding to one sample out of p consecutive samples and in associating, with each of the nodes preserved, an information element identifying its p order antecedent node in said initial trellis, the trace-back of an optimum path in the sub-sampled trellis, by the association, with each node considered, of its p order antecedent node, delivering an information element designating the last two nodes of said optimum path, over-sampling in a ratio p by association, with said information element designating the last two nodes, of a corresponding decoding sequence, comprising said last nodes and all the p−1 intermediate nodes not preserved during said sub-sampling step, p being an integer strictly greater than 1, chosen so that there is a single path between a node and its p order antecedent in said initial trellis.

The term p order antecedent node refers, of course, to the node that is associated, in the initial trellis (i.e. in the standard or usual trellis), with a given node when a partial trace-back is made of p−1 nodes starting from this given node. On the sub-sampled trellis obtained according to the invention, this p order antecedent node actually becomes the direct antecedent node, as will be seen more clearly here below, with reference to FIGS. 2 and 4.

The basic principle of the invention relies on the observation that, in the initial trellis, a part of the information is redundant. Indeed, it is observed that there is a single path connecting two nodes separated by one, two, three or more nodes (depending on the code) owing to the prohibitions of transition of the convolutional code considered.

To make a trace-back of an optimum path, it is therefore not necessary to know all the nodes constituting this optimum path but only those marking the limits of the single path connecting two nodes separated by p−1 nodes.

It is therefore possible to keep only a trellis sub-sampled with a ratio p, without loss of information. In this way, the trace-back of an optimum path is done p times more swiftly.

Advantageously, said method is organized in decoding cycles, a cycle comprising at least one consecutive period, each period comprising the following successive operations:

an operation for the writing, in said sub-sampled trellis, of the data elements associated with all the nodes corresponding to a preserved sample;

at least two operations for the reading, in said sub-sampled trellis, of data elements associated with all the nodes corresponding to a sample, so as to carry out the trace-back on said optimum path.

In a standard way, a cycle comprises several (for example 8) consecutive periods.

Preferably, the ratio between the number of reading operations and the number of writing operations is equal to 3 or 4.

Thus, the length of truncation (the number of samples taken into account for the decoding) is sufficient without its being the case that the number of readings at each period constitutes a restriction on the performance characteristics (in terms of the bit rate) of the decoding.

The invention also relates to a decoding device that implements the above-described device.

A device such as this advantageously comprises means for the sub-sampling, by a ratio p, of said trellis, said means associating, with each of the nodes preserved, its p order antecedent node, means to memorize the sub-sampled trellis, and means for the over-sampling of the data delivered by said trace-back of an optimum path.

It must be noted that the memorization means needed have capacity that is smaller, by a ratio p, than those used in a standard way, the trellis being sub-sampled by the same ratio.

Preferably, said sub-sampling means comprise a bank of $2^\nu$ registers, $\nu$ being the length of constraint of said convolutional code, each comprising p sets of $\nu$ flip-flops, said sets of $\nu$ flip-flops being interconnected in accordance with the model defined by said initial trellis, so that the outputs of said registers respectively deliver the p order antecedent of each of the $2^\nu$ nodes corresponding to a preserved sample.

A technique is applied here that is close to the one used in the case of the register exchange method. However, the size of the registers is reduced to p sets of $\nu$ flip-flops. The surface area of silicon needed therefore remains small.

Advantageously, said memorizing means include a circular random-access memory organized into words of $2^\nu$, $\nu$ bits, where $\nu$ is the length of constraint of said convolutional code, a word containing all the information elements associated with each of the nodes corresponding to a sample.

It is noted, therefore, that the device of the invention, in this preferred embodiment, makes simultaneous use of the means (registers) used in the register exchange method and of the means (circular memory) used in the optimum path trace-back method.

As shall be seen hereinafter, the invention thus combines the advantages of both methods without having their drawbacks.

Preferably, said means for the tracing back of an optimum path comprise means for the addressing of said memory delivering a set of at least two words, and means for the selection, in each of said words, of the information corresponding to the node belonging to said optimum path.

Advantageously, said over-sampling means include a transcoding table associating, with an information element designating the two nodes of said optimum path, the corresponding decoding sequence, comprising said two nodes and the set of the p−1 intermediate nodes not preserved during the sub-sampling.

Thus, the complete sequence of the values is effectively decoded in a manner identical to that of a decoding obtained by means of a standard trellis (but with a gain in bit rate by a ratio p).

Advantageously, said over-sampling means comprise serializing means, delivering said decoding sequence at a rate equal to that of the arrival of said samples.

In this way, when this decoding sequence is observed, everything happens as if a standard trellis had been used.

This device can notably be implanted in an integrated circuit. The silicon surface area needed makes it possible to envisage the production, without difficulty, of a circuit such as this, for example by means of standard 1 μm CMOS technology.

BRIEF DESCRIPTION OF THE DRAWINGS

Other features and advantages of the invention will be seen more clearly from the following description of a preferred embodiment of the invention, given by way of a non-restrictive illustration, and from the appended drawings, of which.

DETAILED DESCRIPTION OF THE INVENTION

Figure 1:
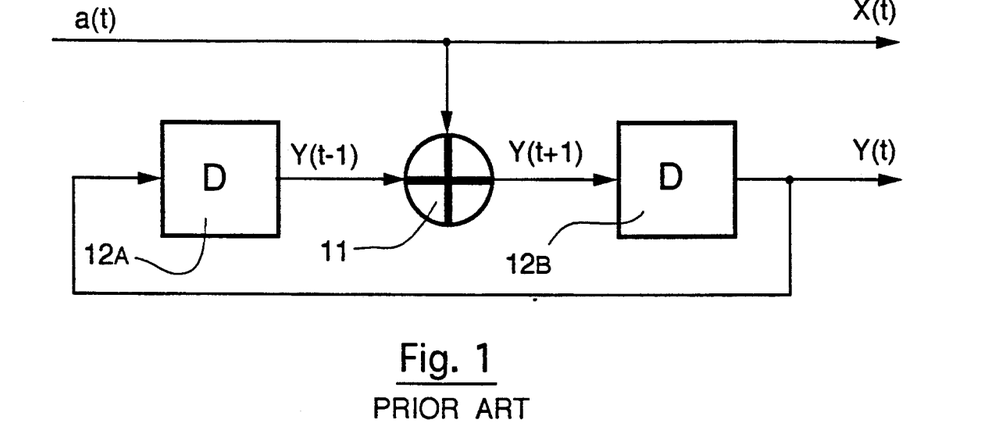
FIG. 1 shows a schematic diagram of a standard convolutional coder with a constraint length $\nu$ equal to 2 and an efficiency of $\frac{1}{2}$.

The principle of the invention is illustrated here below, on the basis of a standard convolutional code, with a constraint length $\nu=2$ and an efficiency $\frac{1}{2}$, obtained by means of an encoder such as is shown in FIG. 1. However, it is clear that the decoding method can be applied to all convolutional codes with an efficiency ETA=M/R (M and R integers, M≧1 and R<1) whatever they may be, by simple extension of the method described, and can be applied notably to the codes usually implemented in the audiodigital coders and in the digital television coders presently being developed. More generally, it is applicable whenever a Viterbi type algorithm can be used, whether it is for the decoding of a standard convolutional code or of a trellis-coded modulation.

FIG. 1 therefore shows a coder that associates two distinct values X(t) and Y(t) with each source data element a(t).

In this example, the first value X(t) is taken to be equal to the source value a(t). The coder furthermore implements a modulo 2 (exclusive-OR) summator 11 and a set of two delay elements $12_A$, $12_B$, which are for example D type flip-flops or the cells of a shift register.

Here, the value Y(t) corresponds to the summation 11 of the source value a(t−1) with the value Y(t−2) stored in the memory cell $12_A$.

Figure 2:
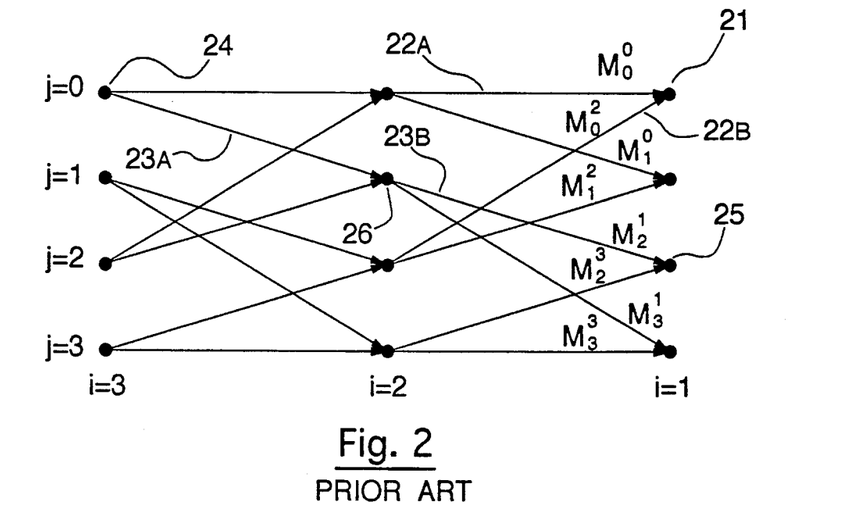
FIG. 2 is a trellis of the coding states, representing the working of the coder of FIG. 1.

The working of this coder may be described by the diagram of the trellis shown in FIG. 2. This presentation has been proposed by G. D. Forney in the article, "The Viterbi Algorithm" (Proc. IEEE, March 1973, 61, No. 3, pp. 268–278).

The Viterbi algorithm is a decoding technique that can be used to find the maximum resemblance path in the trellis, namely the most probable path in relation to the one described at transmission by the coder.

Each node 21 of the trellis used during the decoding contains an information element on the survivor path, among the paths $22_A$ and $22_B$ ending at the node 21. Indeed, the basic principle of the Viterbi algorithm is to consider, in each node, only the most probable path, so as to enable an easy trace-back in the trellis, and hence to enable the a posteriori determination of an estimation of the value received several reception instants earlier.

The trellis used for the decoding, referenced $T(2^\nu, P)$, has a "vertical" dimension equal to the number of possible states of the decoder, namely $2^\nu$, $\nu$ being the length of constraint of the tube, namely the number of memory elements $12_A$, $12_B$ using during the coding, and a "horizontal" dimension, also known as depth, referenced P. In the present case, $2^\nu$ is equal to 4.

It is clear that the greater the value of P the more efficient is the algorithm, since P corresponds to the number of samples received that are taken into account for the decoding of a given sample.

Herein, we consider the theoretical principle of the Viterbi algorithm, decoding a data element at each instant of reception. In practice (as shall be seen hereinafter) and for technical reasons related to the time taken for the trace-back of an optimum path, a decoding cycle (including a trace-back) corresponds to the decoding of several data elements.

In this case, the trellis has a total horizontal dimension $LT+2L$, where LT is the length of truncation, corresponding to the trace-back of the optimum path, and L is the length on which the trace-back and decoding are done simultaneously.

The Viterbi algorithm is notably described in the article by Viterbi A. J., "Error Bounds For Convolutional Codes And An Asymptotically Optimum Decoding Algorithm", IEEE Trans., IT, USA (November 1967), 13, No. 6, pp. 260-269).

A reminder is given here in the standard example of the optimum path trace-back method, of the operations performed in this algorithm in a clock period T:

1/ A computation is made of the distances, also called transition metrics or branch metrics, between the received symbols and the symbols corresponding to the eight possible transitions, namely:

$$L^0_j = \|X' - X^0_j\| + \|Y' - Y^0_j\|$$

$$L^1_j = \|X' - X^1_j\| + \|Y' - Y^1_j\|$$

for j varying from 0 to 3, and where: (X', Y') represents the pair effectively received and sampled on n bits (for example n=4);

$X^0_j$ (and respectively $Y^0_j$) represent the value X (and Y respectively) considered on the transition leading to the state j and corresponding to a value $a(t-2)$ leaving the register of the coder equal to 0;

$X^1_j$ (and respectively $Y^1_j$) represent the value X (and Y respectively) considered on the transition leading to the state j and corresponding to a value $a(t-2)$ leaving the register of the coder equal to 1;

These values are generally computed on n bits, the most significant bit representing the decision and the $n-1$ remaining bits representing the reliability assigned to the decision. The decisions concerned here are therefore weighted or soft decisions.

This weighting is useful especially when the convolutional code implemented is concatenated with one or more other codes, for example a code of the Reed-Solomon type. Indeed, this makes it possible to inform the decoder of this concatenated code of the reliability of the estimation that is transmitted to it.

2/ With each state j, there is associated an adder-accumulator containing the accumulated metric $M_j$ such that:

$$M^0{}_0(t) = M_0(t-1) + L^0{}_0(t-1); M^1{}_0(t) = M_1(t-1) + L^1{}_0(t-1)$$

$$M^0{}_1(t) = M_2(t-1) + L^0{}_1(t-1); M^1{}_1(t) = M_3(t-1) + L^1{}_1(t-1)$$

$$M^0{}_2(t) = M_0(t-1) + L^0{}_2(t-1); M^1{}_2(t) = M_1(t-1) + L^1{}_2(t-1)$$

$$M^0{}_3(t) = M_2(t-1) + L^0{}_3(t-1); M^1{}_3(t) = M_3(t-1) + L^1{}_3(t-1)$$

$$M_j(t) = \min(M^0{}_j(t); M^1{}_j(t))$$

3/ With each state j, there is associated a memory cell, and the entire trellis constitutes a memory with a dimension (4, P). At the first level, the content $s_j$ of the memory cell associated with the state j is set at 0 if $M^0{}_j(t) \leq M^1{}_j(t)$, and at 1 if $M^0{}_j(t) > M^1{}_j(t)$. $s_j$ therefore directly represents the sign $M^0{}_j(t) - M^1{}_j(t)$;

4/ A trace-back is made on the path memorized in the trellis starting from the state provided with an accumulated metric $M_j$ having the smallest value, among 4, or of a metric chosen arbitrarily (in principle, the path converges always towards the best value) and by using, at each level of this trace-back, the contents of the memory cell reached to choose between the two possible transitions. The decoded bit then comes from the memory cell at the level $i = P$, at the end of the traced-back path. Thus, at the instant t, the bit $a(t-P)$ is decoded.

5/ A complete shift is made of the trellis, and the operation is recommenced at the next clock period.

Figure 3:
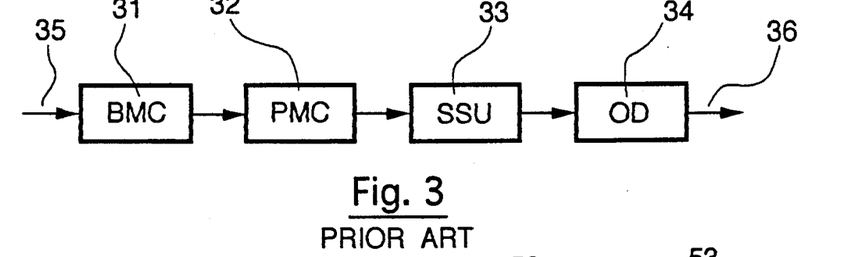
FIG. 3 shows a block diagram of a decoder implementing a Viterbi type algorithm.

FIG. 3 shows a standard block diagram of a Viterbi decoder in the way in which it can be implanted on an integrated circuit. This decoder may be split up into four big consecutive sub-assemblies:

a branch metrics computer (BMC) 31 which processes problems relating to the formatting of input data and to the computation of branch metrics for each sample metric 25 received (step 1/ described here above);

an accumulated metrics computer or path metrics computer (PMC) 32 which, for each node of the trellis, adds branch metrics to the former path metrics, compares them and selects the new optimum path metrics. These different functions are generally summarized in the term ACS (Add-Select-Compare) (step 2/);

a survivors storage and updating (SSU) module 33 which stores the decisions (also called "survivors") coming from the ACS and makes a trace-back of the paths cyclically (trace-back of the survivors) (steps 3/ to 5/);

an output module 34 or output device (OD) providing for the reformatting at output of the decoded data elements 36.

As already mentioned in the introduction, two methods are used conventionally for the making of the storage and updating module 33.

The first method, known as the optimum path trace-back method, relies on the use of a standard RAM to memorize the path metrics. It calls for a great number of operations of access to this memory (writing of the decisions and trace-back of the path, which are operations that have to be performed simultaneously), and this restricts the bit rate of the decoder.

The second method (by register exchange) does not call for any systematic trace-back of the optimum path. Indeed, with each of the states of the trellis, it associates a shift register that contains all the information on the path leading to this state.

This mode of management calls for numerous data exchanges among the different registers but no trace-back as in the first method for each register contains all the information on the path leading to this state.

This is why the register exchange mode can be used for the higher clock frequencies.

However, the interconnections among the different registers, the number of which is proportional to the number of states of the trellis and the size of which is proportional to the chosen length of truncation, notably increase the surface area of the circuit. Furthermore, a register has a greater surface area (at least multiplied by 3) than a memory cell of a RAM.

The invention proposes an intermediate solution between these two known methods, in adding together their advantages and limiting their drawbacks.

The principle of the invention is based notably on the observation that a standard trellis, as shown in FIG. 2, has redundancies, given the prohibitions in the transitions between states (these transitions are a function of the code used and represent this code). Thus, for example, it is observed that there is only one path ($23_A$, $23_B$) joining the nodes 24 and 25. In other words, the path ($23_A$, $23_B$) is completely defined by its limit markers 24 and 25; it is not necessary to know the intermediate node 26.

Figure 4:
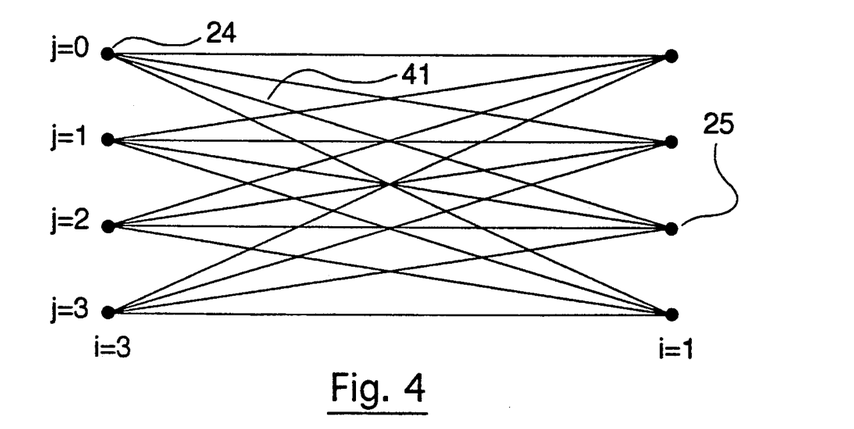
FIG. 4 illustrates the sub-sampled trellis considered according to the invention, corresponding to the standard trellis of FIG. 2.

It can thus be seen that the trellis of FIG. 2 is equivalent to the one shown in FIG. 4 as regards the trace-back of a path. For example, the path 41 is equivalent to the path ($23_A$, $23_B$).

Naturally, during the decoding, it must be known that the path connecting the points 24 and 25 actually goes through the node 26. However, this information is fixed and can therefore be fixed once and for all. The corresponding mechanism is described hereinafter, with reference to FIG. 10.

In other words, it is therefore possible, without loss of information, to carry out a sub-sampling of the standard trellis. Thus the trace-back of the optimum path can be done twice as fast in the example described.

In other cases, as a function of need and of the code considered, the sub-sampling may be a sub-sampling of one in three nodes or one in four or even more nodes. For example it is enough, when using a code with an efficiency $R = \frac{1}{2}$ and when $\nu = 4$, to know one state in four to be able to reconstitute the chain.

Figure 5:
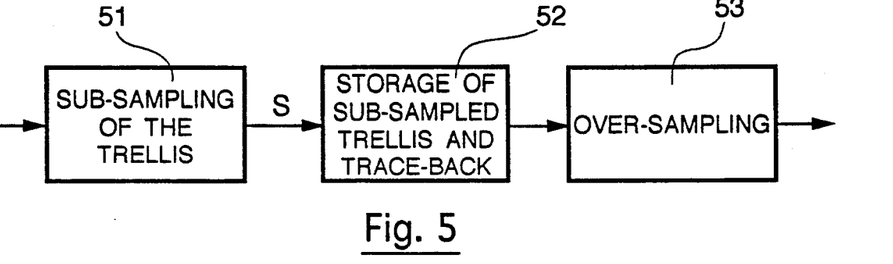
FIG. 5 is a simplified diagram of a module for the memorizing and trace-back of the optimum path of the decoder of FIG. 3.

FIG. 5 shows a general block diagram of the module 33 of the decoder of FIG. 3, in the case of the invention. This memorization and trace-back module comprises:

means 51 for the sub-sampling of the trellis;
means 52 for the storage of the sub-sampled trellis and for the trace-back;
over-sampling means 53 enabling the restitution of all the data elements;

According to the invention, the sub-sampling means 51 are based on registers and work on the general principle of the so-called register exchange technique. They deliver a sequence S of the previous states for each path arriving at a given state, sub-sampled by a ratio p. The working of the module 51 is specified in greater detail here below, with reference to FIG. 6.

This enables the definition of a standard but sub-sampled trellis 52 in which the trace-back of the optimum path can be done in a manner similar to that employed in the so-called "Trace-Back" method but far more swiftly.

It must be noted, however, that unlike in the standard trace-back methods, each node does not contain an information element designating the optimum path (survivor path) by which it can be reached, but an information element identifying its p order antecedent node.

Thus, the surface area of silicon remains small (as compared with the register exchange mode), the registers used being small-sized and the RAM having a size reduced by a factor p, and the processing speed is increased by the same factor p.

In other words, the underlying philosophy of this new system for the management of survivors entails using the so-called "Register Exchange" mode as a booster in order to double or even quadruple the speed of trace-back of the survivors in the so-called "Trace-Back" mode, thus enabling it to process far higher bit rates.

Figure 6:
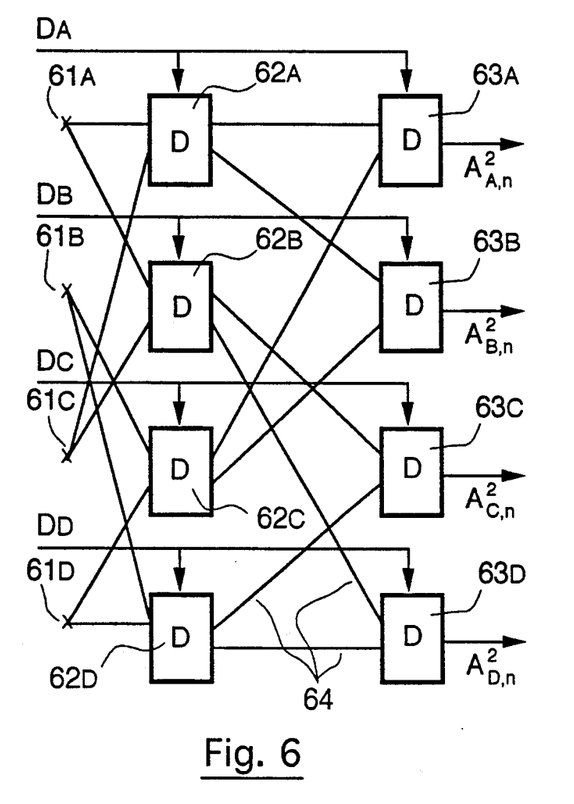
FIG. 6 illustrates the principle of the sub-sampling module of FIG. 5, according to the invention.

FIG. 6 shows the structure of the sub-sampling means 51 in the simple example of the trellis of FIG. 2 ($\nu = 2$). The aim of these means is to indicate, for each node considered, that node from which the survivor has come p cycles earlier, hereinafter called the p order antecedent. As a rule, the p order antecedent of the survivor at the node s and at the instant nT shall be referenced $A^p_{s,n}$.

With each of the four states $61_A$ to $61_B$ considered at each symbol received, there is associated a register of two flip-flops, respectively $62_A$ to $62_D$ and $63_A$ to $63_D$, for the storage of the 1st order antecedent node, namely $A^1_{s,n}$, and of the 2nd order antecedent node, namely $A^2_{s,n}$.

Figure 7:
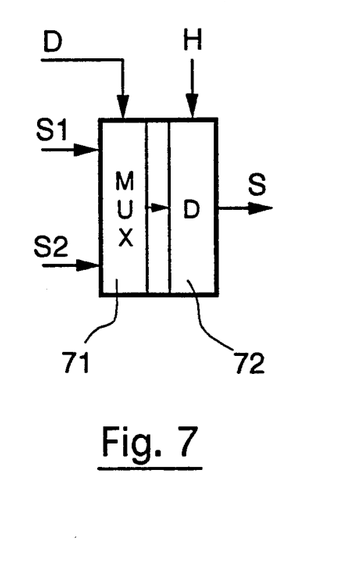
FIG. 7 shows a memory element such as is used in the registers of FIG. 6.

The structure of one of these flip-flops is shown in greater detail in FIG. 7. It comprises a multiplexer 71 which selects one of the two data elements S1, S2 present at its input, as a function of the decision D delivered by the module 32 (FIG. 3). The multiplexer 71 is coupled to a D type flip-flop 72, driven by a clock H working at the rate of the data elements (cycle duration), which delivers the data element $S = DS_1 + \overline{D}S_2$.

Each register has a size of $\nu$ bits (here $\nu = 2$).

More generally, when it is enough to know one state in p to enable the reconstitution of the chain (p order antecedent), then for each of the $2^\nu$ states of the trellis, there will be a register of $p \times \nu$ flip-flops enabling the p order antecedents to be delivered.

The surface area occupied on the silicon is therefore small, as compared with the register exchange method which calls for $2^\nu$ registers of LT (length of truncation) flip-flops.

In a manner similar to that of the register exchange method, the flip-flops $62_A$ to $62_D$ and $63_A$ to $63_D$ are interconnected (64) according to the trellis mode (see FIG. 2) corresponding to the convolutional code used.

Every two cycle durations, this module 51 delivers the $2^\nu$ 2nd order antecedents (more generally in the case of a P rank sub-sampling, each register comprises $p \times \nu$ flip-flops and, every p cycle durations, it delivers the p order antecedent), which are memorized, then re-read in the reverse direction (trace-back) and decoded in accordance with the standard method for the trace-back of an optimum path.

However, through a sub-sampling, there is p times more time available to carry out the different operations (notably the trace-back readings). Conversely, for a given volume of information elements to be processed, the bit rate may be p times higher.

Figure 8:
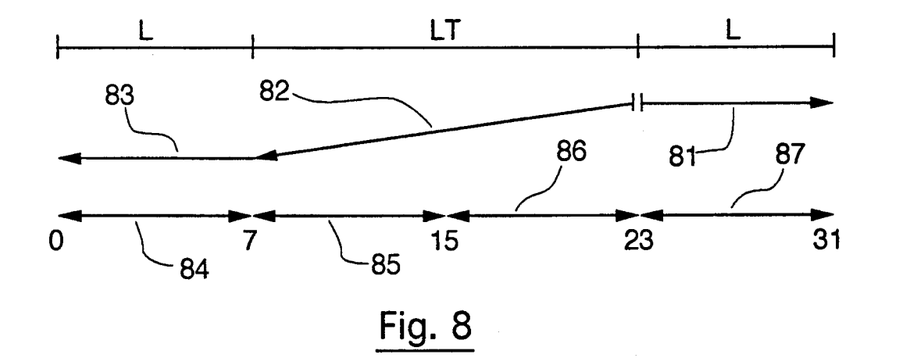
FIG. 8 shows the structure of the memory of the decoder of FIG. 5, in a particular example of the invention.

Before describing the optimum path trace-back mechanism according to the invention, we shall recall the standard structure of a RAM in the case of the path trace-back mechanism, with reference to FIG. 8.

The memory can be segmented into three zones:
a zone 81 for the recording of the decisions coming from the module 32 (FIG. 3);
a zone 82 for the trace-back of the optimum path;
a trace-back and decoding zone 83.

This memory works circularly, the zones 81, 82, 83 being shifted at each decoding period.

So that the incoming data flow may be equal to the outgoing data flow, it is naturally necessary for the number of decoded data elements (83) to be equal to L.

The trace-back of an optimum path is therefore done on LT+L, where LT is the length of truncation. The trace-back therefore consists of a trace-back without decoding (82), and then a trace-back with decoding (83). It is clear that the greater the length of truncation, the more efficient is the convergence of the optimum path.

Hence, according to this method, there is a ratio $R=(LT+L)/L$ between the number of readings and the number of writings to be done. In a standard way, R is chosen so as to be equal to 3 or 4, or even more if the technology or the bit rate allows it. The greater the value of R, the greater is the length of truncation and, consequently, the more efficient is the decoding quality, without any increase in the size of the memory.

Figure 9:
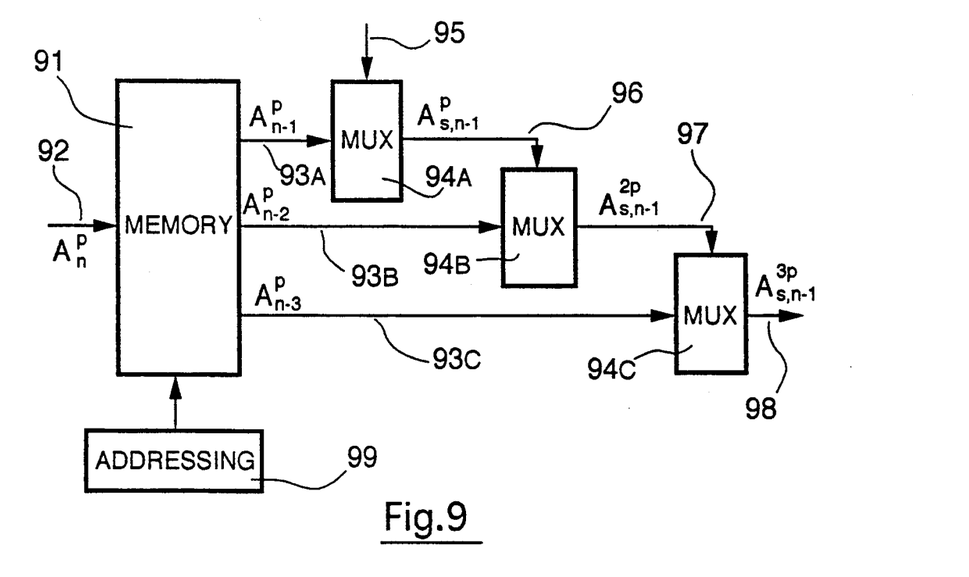
FIG. 9 is a diagram illustrating the operation of the trace-back of the optimum path according to the invention.

FIG. 9 shows the mechanism for the trace-back of an optimum path, in the case of a readings/writings ratio $R=3$.

The data elements delivered by the module of FIG. 6 are stored in a memory 91 of 2LT (LT+L+L, with $L=LT/2$) words of $v.2^v$ bits each. Indeed, each word comprises the $2^v$ p order antecedents corresponding to the $2^v$ possible states of the coding, each coded on $v$ bits.

At a given instant nT, means 99 for the addressing of the memory therefore carry out a writing operation 92 of a word $A^p_n$ corresponding to the antecedents determined by the module 51, then three successive readings $93_A$, $93_B$, $93_C$ are made of the previous words $A^p_{n-1}$, $A^p_{n-2}$, $A^p_{n-3}$, which are delivered respectively to three selection modules $94_A$ to $94_C$ or multiplexers.

As already mentioned, the recorded information designates a node of the trellis (p order antecedent node). On the contrary, according to the standard optimum path trace-back method, it is a path (the survivor) that is memorized. Owing to the sub-sampling, it is no longer possible (without adaptation) to use this method.

The first selection module $94_A$ is controlled by an information element 95, which designates the original node of the optimum path on which the trace-back is to be done. This node may be, for example, the node having the smallest accumulated metric, or a node chosen arbitrarily (in every case there is, in principle, convergence towards the optimum path).

The module $94_A$ thus delivers (96) the p order antecedent $A^p_{s,n-1}$, of the original node, which controls the second selection module $94_B$. This module, in its turn, delivers (97) delivers the p order antecedent of the node $A^p_{s,n-1}$, namely the $2p(A^{2p}_{s,n-1})$ order antecedent of the node designated by the information element 95.

Finally, the last selection module $94_C$ delivers (98) the node $A^{3p}_{s,n-1}$, which is the 3p order antecedent of the original node of the optimum path.

Thus, in three reading operations, it is possible to associate, with an original node, its 3p order antecedent.

By way of an example, a more precise description shall be given of the working of this system in the case of a conventionally used convolutional code, having a constraint length $v=6$ and an efficiency ½, for which it is sufficient to know one state out of four in the trellis to make a trace-back on a path.

In this case, the module 51 (FIG. 5) delivers the 4th order antecedents of the states considered. (It would also be possible, naturally, for this module 51 to deliver only the second order antecedents, if a doubling of the trace-back speed is not sufficient).

The words delivered by this module 51 include the 64 ($2^v$) 4th order antecedents. They are therefore constituted by $v.64=384$ bits and are delivered every four cycle durations.

We shall consider the case of a decoder having a length of truncation LT equal to 64, with a ratio between readings and writings $R=3$.

The memory should therefore have a storage capacity of 2LT/4, i.e. 32 words since only one in four states is memorized.

This memory behaves like a circular register, and may be divided into four eight-word sectors (FIG. 8):
first sector 84: addresses 0 to 7;
second sector 85: addresses 8 to 15;
third sector 86: addresses 16 to 23;
fourth sector 87: addresses 24 to 31.

A full decoding cycle lasts 8 periods, each comprising four cycle durations.

If, for example, the writing address counter is at the address 24 (the start of the fourth sector 87) at the instant n, then the first period consists of the following operations:

writing of $A^4_n$ at the address 24, namely at the start of the fourth sector 87;

reading of $A^4_{n-1}$ at the address 23, namely at the end of the third sector 86, and selection (96, FIG. 9) of $A^4_{0,n-1}$ (here the node 0 is fixed systematically as the start of the optimum path);

reading of $A^4_{n-2}$ at the address 22 and selection (97) of $A^8_{0,n-1}$, the fourth order antecedent of $A^4_{0,n-1}$;

reading of $A^4_{n-3}$ at the address 21 and selection of $A^{12}_{0,n-1}$.

The procedure is continued in this way, always with a ratio of 3 between writing and reading. The eight and last period therefore comprises.

writing at the address 31 of $A^4_{n-7}$;

reading at the address 2 of $A^4_{n-2^2}$ and selection of $A^{88}_{0,n-1}$;

reading at the address 1 of $A^4_{n-2^3}$ and selection of $A^{92}_{0,n-1}$;

reading at the address 0 of $A^4_{n-2^4}$ and selection of $A^{96}_{0,n-1}$.

At the next cycle, the writing is done at the address 0 and a new procedure of tracing back the survivors is launched, starting from the address 31.

For each trace-back of the survivors, the last eight readings are stored in a LIFO (Last In First Out) buffer memory and re-read at the rate of one node for every four cycle durations so as to regenerate a flow of continuous data elements sent to the decoding memory.

Figure 10:
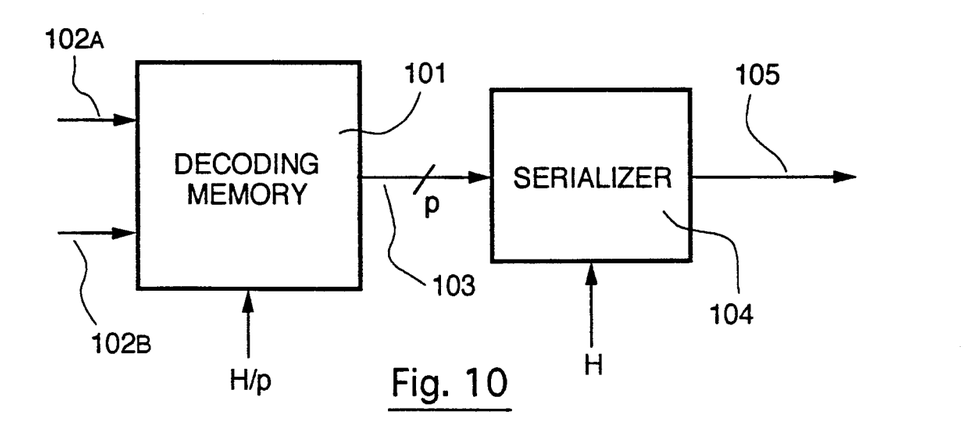
FIG. 10 shows the structure of the over-sampling module of FIG. 5.

An embodiment of this module 53 is illustrated in FIG. 10.

It is indeed necessary, at output of the decoder, to give all the decoded values and not only the sequence, sub-sampled by a ratio p, of the states of the system.

It has been seen, however, that the sub-sampling ratio p is chosen so that there is a single path between two consecutive nodes. Hence, with these two nodes being known, it is easy to reconstitute the complete sequence by means of a single table.

The over-sampling module therefore comprises a decoding ROM (read-only memory) 101 which contains a table associating, with the pair formed by the starting node $102_A$ and the arrival node $102_B$, the full sequence 103 of the p nodes included between the starting node and the arrival node.

This sequence is delivered every p cycle durations, i.e. at the rate of a clock H/P, H defining the cycle duration.

It is sent to a serializer 104, which works at the rate of the clock H and successively delivers the data elements 105 representing the decoding decisions. Thus, for the output module 34 (FIG. 3), the data elements are presented identically to the way in which they would have been presented in the case of a decoder with standard trace-back of an optimum path.

However, the operating speed has been increased by a factor p, and the silicon surface area required remains quite acceptable.

Indeed, in the above described example of the decoding of a convolutional code with a constraint length $v=6$, and efficiency $\frac{1}{2}$, the memory of 32 words of 384 bits takes up about 15 mm² in 1 μm CMOS technology.

The entire circuit, comprising the registers of the sub-sampling module, the 32-word memory, the buffer memory (LIFO) and the decoding read-only memory, then takes up a surface area of less than 50 mm².

This represents a very substantial gain over the surface area needed for an equivalent standard decoder working by register exchange. Indeed, the implementation of the management of the survivors then calls for 64 registers of 64 flip-flops, giving 4,100 flip-flops, representing at least 41,000 logic gates, giving a surface area of 41 mm² at a rate of 1000 gates/mm² in 1 μm CMOS technology.

It is generally estimated that the interconnections double the surface area, taking it to 80 mm².

Should it suffice to use simply a ratio 2, then the register part requiring half as many registers occupies simply 15 mm². By contrast, the circular RAM, being constituted by 64 words of 384 bits for the same length of truncation, occupies about 30 mm². The total surface area will therefore be practically the same.

The new mode of management of the survivors according to the invention therefore makes it possible to process very high bit rates, while at the same time calling for a smaller surface area of circuit than the register exchange mode.

It can be used by any circuit implementing the Viterbi algorithm by decoding both convolutional codes (for example for digital audio broadcasting or DAB) and trellis-coded modulations (TCM), for example for digital television.

What is claimed is:

1. A method for the maximum likelihood decoding of a sequence of samples corresponding to the convolutional coding of a sequence of digital source elements, of the type implementing a Viterbi algorithm type of decision algorithm, defining an initial decoding trellis, constituted by a set of nodes corresponding to the possible states of the coding, each node being connected to its most probable direct antecedent node, and consisting in making a trace-back of an optimum path in said trellis, said method comprising the following steps:

sub-sampling, by a ratio p, of said initial trellis, consisting in preserving only the nodes corresponding to one sample out of p consecutive samples and in associating, with each of the nodes preserved, an information element identifying its p order antecedent node in said initial trellis, the trace-back of an optimum path in the sub-sampled trellis, by the association, with each node considered, of the p order antecedent node, delivering an information element designating the last two nodes of said optimum path, over-sampling by a ratio p by association, with said information element designating the last two nodes of said optimum path, of a decoding sequence corresponding to said last two nodes as well as to all the p-1 intermediate nodes not preserved during said sub-sampling step, p being an integer strictly greater than 1, chosen so that there is a single path between a node and its p order antecedent in said initial trellis.

2. A decoding method according to claim 1, organized in decoding cycles, a cycle comprising at least one consecutive period, each period comprising the following successive operations:

an operation for the writing, in said sub-sampled trellis, of the data elements associated with all the nodes corresponding to a preserved sample, at least two operations for the reading, in said sub-sampled trellis, of data elements associated with all the nodes corresponding to a sample, so as to carry out the trace-back on said optimum path.

3. A method according to claim 2, wherein the ratio between the number of reading operations and the number of writing operations is equal to 3 or 4.

4. Decoding apparatus for the maximum likelihood decoding of a sequence of samples corresponding to the convolutional coding of a sequence of digital source elements, of the type implementing a Viterbi algorithm type of decision algorithm, defining an initial decoding trellis, constituted by a set of nodes corresponding to the possible states of the coding, each node being connected to its most probable direct antecedent node, and consisting in establishing a trace-back of an optimal path in said trellis, said apparatus comprising:

sub-sampling means for sub-sampling, by a ratio p, of said initial trellis, consisting in preserving only the nodes corresponding to one sample out of p consecutive samples, the sub-sampling means associating, with each of the nodes preserved, its p order antecedent node;

trace-back means for tracing back an optimal path in the sub-sampled trellis, by the association, with each node considered, of the p order antecedent node, the trace-back means delivering an information element designating at least the last two nodes of said optimal path;

memory means for storing the sub-sampled trellis; and over-sampling means for over-sampling the information element delivered by said trace-back means of an optimal path, p being an integer strictly greater than 1, chosen so that there is a single path between a node and its p order antecedent in said initial trellis.

5. A device according to claim 4, wherein said sub-sampling means comprise a bank of $2^v$ registers, $v$ being the length of constraint of said convolutional code, each comprising p sets of $v$ flip-flops, said sets of $v$ flip-flops being interconnected in accordance with the model defined by said initial trellis, so that the outputs of said registers respectively deliver the p order antecedent of each of the $2^\nu$ nodes corresponding to a preserved sample.

6. A device according to claim 4, wherein said memory means comprises a circular random-access memory organized into words of $2^\nu.\nu$ bits where $\nu$ is the length of constraint of said convolutional code, a word containing all the information elements associated with each of the nodes corresponding to a sample.

7. A device according to claim 6, wherein said traceback means comprise means for the addressing of said memory delivering a set of at least two words, and means for the selection in each of said words, of the information corresponding to the node belonging to the optimal path.

8. A device according to claim 4, wherein said oversampling means include a transcoding table associating, with an information element designating the at least last two nodes of said optimal path, a decoding sequence corresponding to said two nodes and to the set of the p−1 intermediate nodes not preserved during the subsampling.

9. A device according to claim 8, wherein said oversampling means comprise serializing means, delivering said decoding sequence at a rate equal to that of the arrival of said samples.

10. A device according to claim 4, implanted in an integrated circuit.

* * * * *

UNITED STATES PATENT AND TRADEMARK OFFICE
CERTIFICATE OF CORRECTION

PATENT NO. : 5,329,537
DATED : July 12, 1994
INVENTOR(S) : MICHEL ALARD, DAMIEN CASTELAIN, JEAN-FRANCOIS HELARD It is certified that error appears in the above-indentified patent and that said Letters Patent is hereby corrected as shown below:

Col. 5, line 22, delete "$2^v,v$", insert --$2^v \cdot v$--

Col. 7, line 32, after "here", insert --,--

Col. 7, delete lines 40-43, and insert $$L^0{}_j = |X' - X^0{}_j| + |Y' - Y^0{}_j|$$
$$L^1{}_j = |X' - X^1{}_j| + |Y' - Y^1{}_j|$$

Col. 8, line 12, delete "$M_i(t)$", insert --$M_j(t)$--

Col. 11, line 31, delete "$v.2^v$", insert --$v \cdot 2^v$--

Col. 15, line 5, delete "$2^v.v$", insert --$2^v \cdot v$--

Signed and Sealed this

Seventh Day of February, 1995

Attest:

BRUCE LEHMAN

*Attesting Officer*    *Commissioner of Patents and Trademarks*

UNITED STATES PATENT AND TRADEMARK OFFICE
CERTIFICATE OF CORRECTION

PATENT NO. : 5,329,537
DATED : July 12, 1994
INVENTOR(S) : MICHEL ALARD, DAMIEN CASTELAIN, JEAN-FRANCOIS HELARD It is certified that error appears in the above-indentified patent and that said Letters Patent is hereby corrected as shown below:

On the Title Page, delete [73] Assignee: France Telecom, Paris, France insert [73] Assignee: France Telecom and Telediffusion de France, both of Paris, France Signed and Sealed this Fourth Day of July, 1995

*Attest:*

BRUCE LEHMAN

*Attesting Officer*   *Commissioner of Patents and Trademarks*